United States Patent
Lu et al.

(10) Patent No.: US 7,272,060 B1
(45) Date of Patent: Sep. 18, 2007

(54) METHOD, SYSTEM, AND CIRCUIT FOR PERFORMING A MEMORY RELATED OPERATION

(75) Inventors: Qiang Lu, San Mateo, CA (US); Richard Fastow, Cupertino, CA (US); Zhigang Wang, Sunnyvale, CA (US)

(73) Assignee: Spansion LLC, Sunnyvale, CA (US)

( * ) Notice: Subject to any disclaimer, the term of this patent is extended or adjusted under 35 U.S.C. 154(b) by 253 days.

(21) Appl. No.: 11/001,940

(22) Filed: Dec. 1, 2004

(51) Int. Cl.
*G11C 7/00* (2006.01)
*G11C 5/14* (2006.01)

(52) U.S. Cl. .............. 365/203; 365/189.09; 365/204; 365/220

(58) Field of Classification Search ............. 365/203, 365/220
See application file for complete search history.

(56) References Cited

U.S. PATENT DOCUMENTS

| | | | |
|---|---|---|---|
| 5,524,094 A * | 6/1996 | Nobukata et al. ....... | 365/185.21 |
| 6,337,807 B2 * | 1/2002 | Futatsuyama et al. . | 365/185.17 |
| 6,396,764 B1 * | 5/2002 | Holland ................... | 365/230.03 |
| 6,490,212 B1 * | 12/2002 | Nguyen et al. ............. | 365/207 |
| 6,525,969 B1 * | 2/2003 | Kurihara et al. ........ | 365/185.25 |
| 6,639,842 B1 * | 10/2003 | Hoang et al. ........... | 365/185.28 |
| 2002/0064075 A1 * | 5/2002 | Morishima ................... | 365/203 |
| 2003/0026145 A1 * | 2/2003 | Lee ............................. | 365/200 |
| 2003/0151966 A1 * | 8/2003 | Demone ..................... | 365/222 |
| 2004/0008561 A1 * | 1/2004 | Lee et al. .................... | 365/222 |
| 2004/0059840 A1 * | 3/2004 | Perego et al. ................. | 710/6 |
| 2005/0078525 A1 * | 4/2005 | Guo et al. ............. | 365/185.28 |

* cited by examiner

*Primary Examiner*—Amir Zarabian
*Assistant Examiner*—Ly Duy Pham (57) ABSTRACT

A method, system, and circuit for performing a memory related operation are disclosed. An operating voltage is applied to a bitline and a neighboring bitline is precharged. The precharge voltage has a magnitude less than the operating voltage. Both voltages ramp up at like or different rates. The precharge voltage can reach its effective magnitude prior to or with the operating voltage reaching its effective value.

16 Claims, 7 Drawing Sheets

METHOD, SYSTEM, AND CIRCUIT FOR PERFORMING A MEMORY RELATED OPERATION

TECHNICAL FIELD

The present invention relates to flash memory. More specifically, embodiments of the present invention relate to a method, system, and circuit for performing a memory related operation.

BACKGROUND

Flash memory devices comprise a plurality of memory cells formed by complimentary metal oxide semiconductor (CMOS) transistors. Flash memory cells are typically electrically intercoupled and coupled to program and read circuitry by wordlines and bitlines. Individual wordlines and bitlines are electrically isolated one from another by dielectric, such as shallow trench isolation (STI) areas.

Technology progresses in flash memory with scaling, which increases the density of active devices (e.g., memory cells and other transistors, etc.), wordlines, bitlines, etc. Increasing memory density results in dimension reduction therein. For instance, the distance separating neighboring bitlines is reduced as memory is scaled down and the dimensions of STI and other dielectric isolating them becomes shallower and/or thinner.

During memory operation, such as programming and reading a cell, a relatively high operating voltage, such as a programming voltage $V_P$ (e.g., 5 Volts) or a read voltage $V_R$ (e.g., 0.8 Volts) is placed upon the bitline of the cell being programmed or read. Conventionally, the neighboring bitlines (e.g., the bitlines adjacent to) the bitline of the cell being programmed/read are held at a ground potential (e.g., zero Volts). Thus, during conventional memory operations, a voltage differential can exist between the bitline of the cell being operated and its neighboring bitlines.

As memory technology is scaled down, the relatively high operating voltages such as $V_P$ and $V_R$ become more significant over the reduced microscopic dimensions. Further, the decreasing distance between bitlines and the reduced dimensions of STI isolating bitlines can effectively reduce electrical isolation between bitlines. Thus, scaling down increases the possibility of transdielectric electrical interaction between neighboring bitlines as memory device technology is scaled down.

Inter-bitline leakage current is one such interaction. Inter-bitline leakage current can be driven through dielectric separating neighboring bitlines by voltage differential existing or arising between the neighboring bitlines. Inter-bitline leakage current can have undesirable effects. This leakage current can deter proper memory operations, such as programming and read.

The high voltage on the bitline connected to the cell being operated conventionally applied with the neighboring bitlines grounded cause a voltage differential ($\Delta V$) between the bitlines. For instance, where a $V_P$ of 5 Volts is applied to the operating cell's bitline and the neighboring bitlines are grounded at zero Volts, a $\Delta V$ of 5 Volts arises. At the microscopic distances between these bitlines and/or the reduced STI dimensions that can characterize scaled down memory technology, this $\Delta V$ can be significant enough to drive a transdielectric leakage current $I_{lkg}$ between these bitlines, e.g., through or underneath the STI.

The transdielectric leakage current between the operational bitline and its neighboring bitlines can effectively reduce the operating voltage on the bitline of the cell being programmed/read, and/or raise the voltage on the neighboring bitlines, connected to other cells not being operated. Reducing the programming voltage to a memory cell's bitline, such as due to leakage current with neighboring bitlines, can have the undesirable effect of misprogramming. For clarity and brevity, 'programming' is discussed hereinafter by way of explanation, illustration, and example. However, other memory operations such as 'read' are also intended to be illustrated by this discussion as well.

Misprogramming can occur where the programming voltage is inadequate to fully program a memory cell. For instance, where a fully programmed cell retains a digital '1' value and an unprogrammed cell retains a digital '0' value, leakage current can reduce the operating bitline voltage such that the cell being programmed does not attain the voltage value needed to fully program it. Rather than a digital '1' or a digital '0', the voltage value on the program cell corresponds to an indeterminate value between '0' and '1'. Multi-level memory cells can be effected as well.

Further, where the neighboring bitlines are connected to unprogrammed cells, the leakage current driven voltage rise on those bitlines can result in erroneous or partial programming on the unprogrammed cells. For instance, where non-programmed cells retain a digital '0' value and a neighboring programmed cell retains a digital '1' value, leakage current can increase the bitline voltage on the non-programmed neighboring cells, such that the neighboring cells not to be programmed do not remain at a zero logical value. Rather than a digital '0', the voltage value on the neighboring non-programmed cells can rise to correspond to indeterminate values between '0' and '1'. Such misprogramming and partial programming can cause data errors such as misread cells and other memory reliability problems.

Similar problems can occur with a read operation. Undesirable leakage current between a cell to be read (e.g., applied with $V_R$) and the neighboring cells (grounded) can result in false read results. Where the cell to be read is in a digital '0' state, and one or both of the neighboring cells is (are) in a digital '1' state, the inter-bitline leakage currents can erroneously render a value between the digital '0' and the digital '1' for the read operation.

SUMMARY

Accordingly, what is needed is a method, system, and/or circuit for performing memory related operations, such as programming and reading a memory cell, which reduces leakage current between the bitline of the cell being operated and neighboring bitlines, connected to cells not being operated. What is needed is a system, method, and/or circuit for performing memory related operations, which reduces misprogramming of a cell being operated and/or erroneous partial programming of cells not being operated.

A method, system, and circuit for performing a memory related operation are disclosed. An operating voltage is applied to a bitline and a neighboring bitline is precharged. The precharge voltage has a magnitude less than the operating voltage. Both voltages ramp up at like or different rates. The precharge voltage can reach its effective magnitude prior to or with the operating voltage reaching its effective value.

In one embodiment, a method, system, and circuit allow a memory cell to be operated, without significant leakage current being driven between the bitline of a memory cell being operated and neighboring bitlines relating to memory cells not being operated, e.g., without significant inter-bitline leakage current.

In one embodiment, a method, system, and circuit operate (e.g., read and/or program) a memory cell without significant inter-bitline leakage current driven reduction in operating voltages (e.g., read and program voltages $V_R$ and $V_P$, respectively) applied to the memory cell being operated. In one embodiment, the method, system, and circuit operate a memory cell without significant inter-bitline leakage current driven rise in erroneous and/or partial operating voltage on bitlines related to neighboring memory cells, e.g., cells not being operated.

In one embodiment, the method, system, and circuit pre-charges the neighboring bitlines of memory cells not being operated to a voltage less than the operating voltage (e.g., $V_R$ and/or $V_P$) applied to the cell being operated. In one embodiment, the neighboring bitlines are pre-charged before the operating voltage is applied to the bitline of the cell being programmed. In one embodiment, the neighboring bitlines are pre-charged at the time the operating voltage is applied to the bitline of the cell being programmed.

DETAILED DESCRIPTION

A method, system, and circuit for performing a memory related operation are disclosed. Such operations can include programming, read, etc. In one embodiment, the method, system, and circuit pre-charges neighboring bitlines of memory cells not being operated to a voltage less than the operating voltage (e.g., $V_R$ and/or $V_P$) applied to the cell being operated. In one embodiment, the neighboring bitlines are pre-charged before the operating voltage is applied to the bitline of the cell being operated. In one embodiment, the neighboring bitlines are pre-charged at the time the operating voltage is applied to the bitline of the cell being operated.

Pre-charging the neighboring bitlines during or prior to application of operating voltage to the bitline of the cell being operated (e.g., the operating bitline) ameliorates the voltage differential between the bitlines of the cell being operated and its neighboring bitlines. Ameliorating this voltage differential can effectively deter inter-bitline electrical disturbances. For instance, ameliorating the voltage differential between them can deter the driving of trans-dielectric leakage current between the operating bitline and its neighboring bitlines.

Deterring such electrical disturbances can promote attaining full operating voltage on the drain of the cell being charged. Further, deterring such electrical disturbances can dampen erroneous and/or partial charging of cells connected to the neighboring bitlines. Therefore, embodiments of the present invention prevent or reduce operating failure of memory cells such as misprogramming and/or misreading. Further, embodiments of the present invention prevent or reduce erroneous and/or partial programming of memory cells connected to neighboring bitlines of cells being operated. Advantageously, embodiments of the present invention can be applied to deter inter-bitline electrical disturbances as scaling reduces the distance between an operating and neighboring bitlines and the dimensions of dielectric (e.g., shallow trench isolation areas) electrically isolating these bitlines from each other.

A programming operation on a memory cell comprising a NOR type flash memory array is discussed herein without necessarily referring further to other memory types or to other memory cell operations such as read. This is done for clarity and brevity in describing general operating principles of embodiments of the present invention. Although embodiments of the present invention are explained herein with reference to programming operations, it is appreciated that embodiments of the present invention are well suited for use in other memory cell operations such as read and with other types of memory arrays as well.

Figure 1:
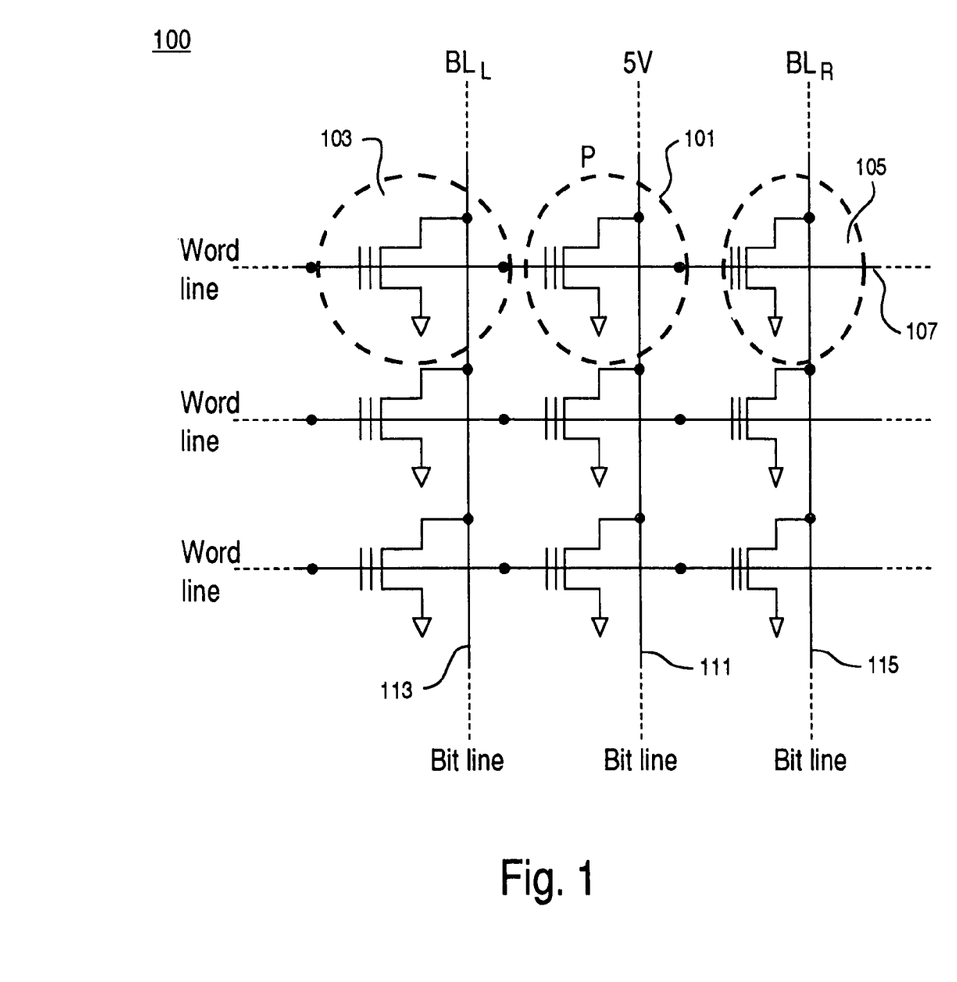
FIG. 1 depicts an exemplary flash memory array with a cell being operated with neighboring memory cells not being operated, according to an embodiment of the present invention.

FIG. 1 depicts an exemplary flash memory array 100 with a cell 101 being operated with neighboring memory cells 103 and 105 not being operated, according to an embodiment of the present invention. Cell 101 (e.g., cell 'P') is operated, for instance programmed by raising the voltage on its wordline 107 to a first relatively high voltage (e.g., 9 Volts) and the voltage on its bitline 111 to a second relatively high voltage (e.g., 5 Volts). In one embodiment, the second voltage on the bitline is lower than the operating wordline voltage, but higher than zero voltage (e.g., ground potential), which can be present on the wordline 107 and the bitline 111 prior to operation. The operation of cell 101 can be any type of memory operation, such as a programming operation or a read operation.

In one embodiment of the present invention, during or prior to applying the programming (e.g., or other operating) voltage to bitline 111, a significant disturbance deterring voltage (e.g., 1.5 Volts) is applied to bitlines 113 and 115, neighboring operating bitline 111. This ameliorates the differential voltage $\Delta V$ between the operating bitline 111 and the neighboring bitlines 113 and 115. For instance, in an exemplary memory wherein the programming voltage $V_P$ is 5 Volts and the deterring voltage between operating bitline 111 and neighboring bitlines 113 and 115 is 1.5 Volts, the $\Delta V$ is 3.5 Volts.

Without the deterring voltage applied to neighboring bitline 113 and 115, the $\Delta V$ between them and the operating bitline 111 would be a full 5 Volts. By applying the deterring voltage therefore, an embodiment of the present invention deters inter-bitline electrical disturbances, such as inter-bitline leakage current, between operating bitline 111 and its neighboring bitlines 113 and 115. Preventing electrical disturbances between operating bitline 111 and neighboring bitlines 113 and 115 can effectively prevent or reduce misprogramming cell 101. Further, preventing electrical disturbances between operating bitline 111 and neighboring bitlines 113 and 115 can effectively prevent or reduce erroneous mischarging or partially programming cells 103 and 105. This can be advantageous in memory arrays configured by technologies wherein dimensions between bitlines are reduced and device densities are increased.

Figure 2:
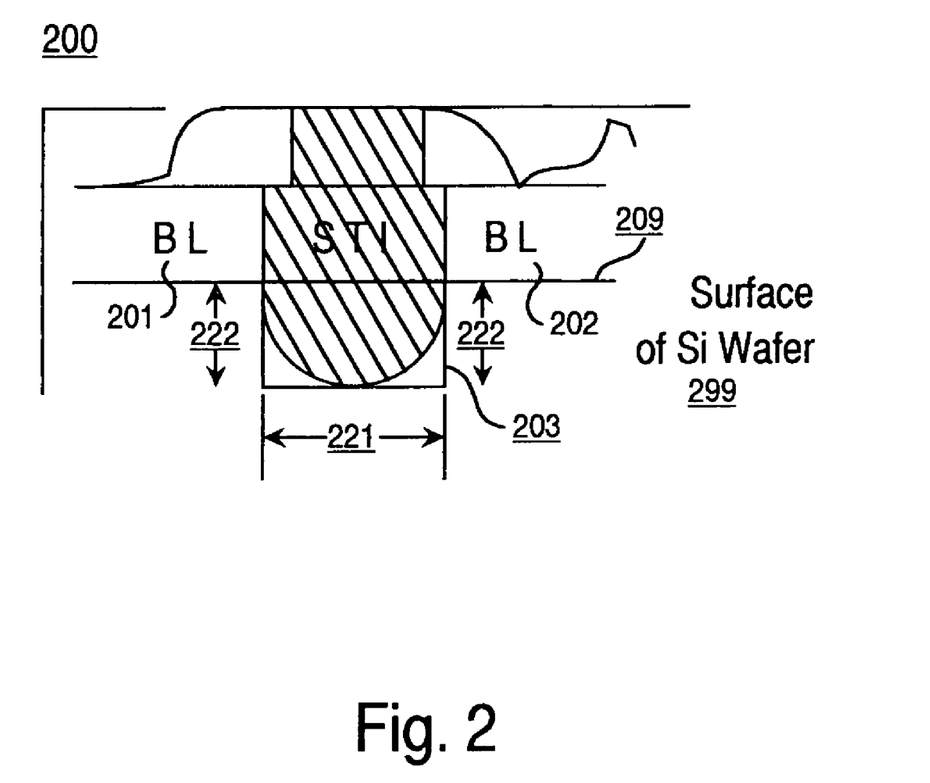
FIG. 2 depicts exemplary memory array section having neighboring bitlines isolated from each other by a shallow trench isolation area, according to an embodiment of the present invention.

FIG. 2 depicts an exemplary memory array section 200 having neighboring bitlines isolated from each other by a shallow trench isolation area, according to an embodiment of the present invention. Viewed cross-sectionally, section 200 comprises bitlines 201 and 202 deposited upon the surface 209 of a silicon substrate 299. Bitline 201 can be an operating bitline. Bitline 202 is a neighboring (e.g., adjacent) bitline to operating bitline 201.

Bitlines 201 and 202 are electrically isolated from each other by dielectric, in one embodiment comprising a shallow trench isolation (STI) area 203. STI 203 can comprise a material such as tetraethyl orthosilicate (TEOS), silane, or another suitable dielectric. STI area 203 extends above surface 209 and extends below the surface into substrate 299 to a depth illustrated by dimension 222. STI 203 has a width illustrated herein by dimension 221.

Besides the inherent and/or modified dielectric properties of the material comprising STI 203, the electrical isolation that STI area 203 provides between bitlines 201 and 202 is affected (e.g., to some significant degree), by the size of dimensions 221 and 222. An embodiment of the present invention pre-charges neighboring bitline 202 (e.g., connected to a memory cell not being operated) to a voltage less than the operating voltage (e.g., $V_R$ and/or $V_P$), which is applied to operating bitline 201.

In one embodiment, neighboring bitline 202 is precharged at the time the operating voltage is applied to bitline 201. In another embodiment, neighboring bitline 202 is pre-charged before the operating voltage is applied to bitline 201. Pre-charging bitline 202 before or at the time operating voltage is applied to bitline 201 ameliorates the $\Delta V$ that would otherwise develop between bitlines 201 and 202.

Ameliorating this $\Delta V$ can effectively deter electrical disturbances such as leakage current between bitlines 201 and 202 as bitline 201 receives operating voltage. Advantageously therefore, an embodiment of the present invention renders less critical the size of dimensions 221 and 222 to the electrical isolation that STI area 203 provides between bitlines 201 and 202, and thus readily supports scaling down memory technology.

Figure 3:
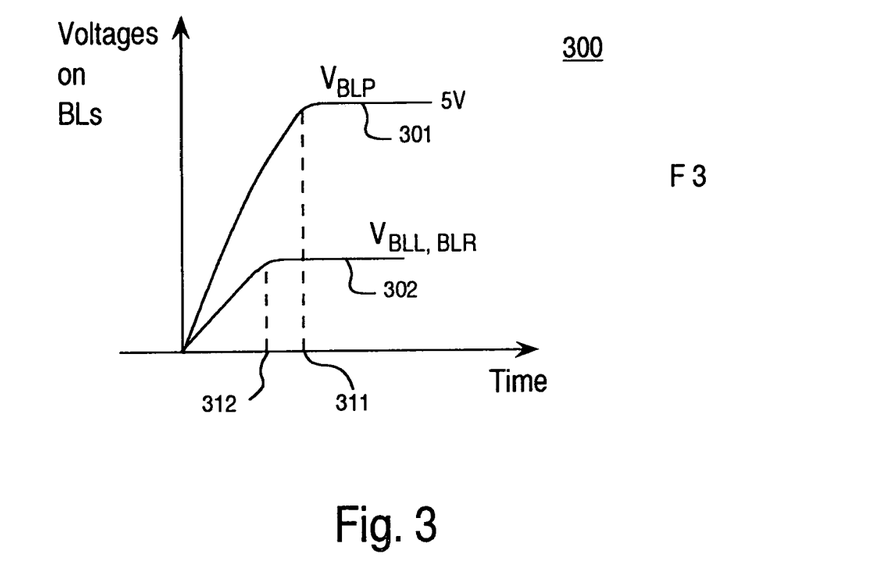
FIG. 3 depicts an exemplary bitline voltage ramp curve, according to an embodiment of the present invention.

FIG. 3 depicts an exemplary bitline voltage ramp curve 300, according to an embodiment of the present invention. Voltage ramp curve 300 plots voltage applied to operating and neighboring bitlines as a function of time. Curve 301 plots an exemplary operating voltage applied to a bitline associated with a cell to be operated (e.g., an operating bitline). Curve 302 plots an exemplary operating voltage applied to a bitline that neighbors the operating bitline.

As shown by curve 301, in the present embodiment, the operating voltage ramps up to a maximum operating voltage (e.g., $V_P$, $V_R$, etc.). The operating voltage may depend on the characteristic memory technology (e.g., type, scaling, etc.). For instance, some flash memory cells are programmed by placing a voltage on the order of 5 Volts on the bitline associated with the drain of the cell being programmed (e.g., $V_P$=5 Volts). Maximum operating voltage is achieved at time 311, In one embodiment, as the operating voltage ramps up, a precharge voltage ($V_{Prech}$) applied to the neighboring bitlines. As shown by curve 302, in the present embodiment, the precharge voltage ramps up at a lower rate than the operating voltage. Maximum precharge voltage is reached at time 312. The precharge voltage may also depend on the characteristic memory technology. For instance, in flash memory scaled to 0.13 micrometer technology wherein $V_P$ is 5 Volts, the maximum precharge voltage may be on the order of 1.5 Volts (e.g., $V_{Prech}$=1.5 Volts).

In the embodiment discussed with reference to FIG. 3, the ramp-up rate of curve 301 exceeds that of curve 302. However, full precharge voltage is reached at time 312, earlier than full operating voltage is reached at time 311. In another embodiment, operating and precharge voltages may ramp up at the same rate. In yet another embodiment, operating and precharge voltages may ramp up at different rates, yet their maxima may be reached effectively simultaneously.

Figure 4:
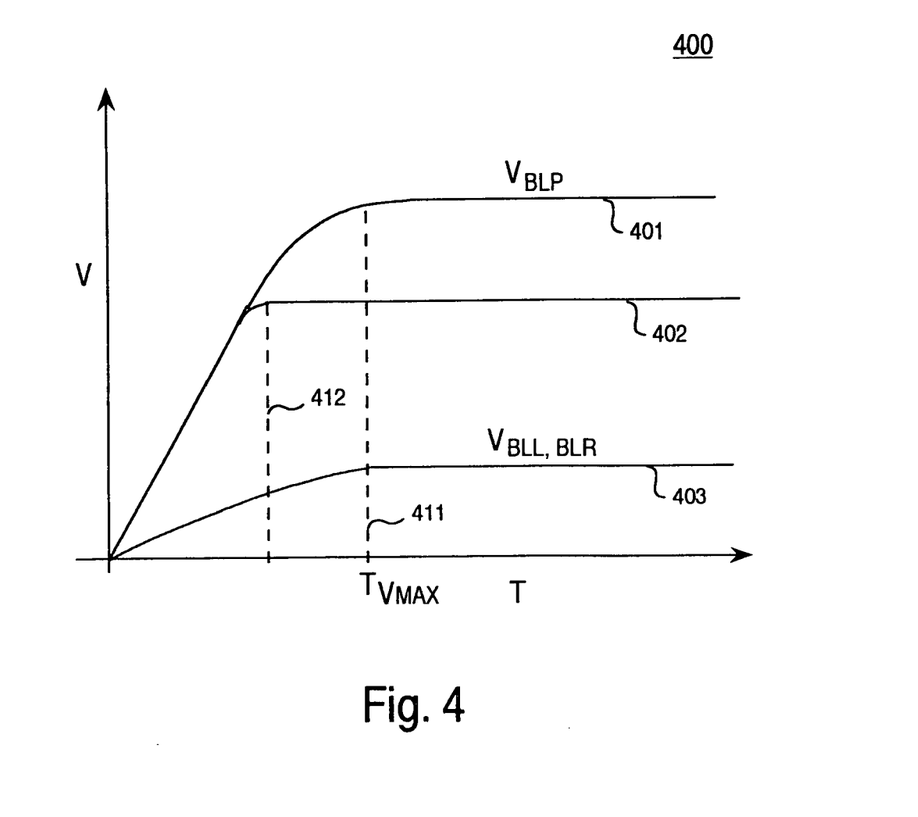
FIG. 4 depicts exemplary bitline voltage ramp curves, according to an embodiment of the present invention.

FIG. 4 depicts exemplary bitline voltage ramp curves 400, according to an embodiment of the present invention. In one embodiment, the operating voltage ramps up as shown by curve 401 and the precharge voltage on a neighboring bitline ramps up as shown by curve 403. In the present embodiment, the operating and precharge voltages ramp up at different rates, yet their maxima are both reached at time 411.

In another embodiment, the precharge voltage on a neighboring bitline ramps up as shown by curve 402. In this alternative embodiment, the operating voltage and the precharge voltage ramp up at the same rate. However, the precharge voltage reaches its maximum at time 412, earlier than that of the operating voltage.

While the maximum precharge voltage shown by curve 402 is shown as higher than that of curve 403, this is for clarity of illustration herein. The maximum precharge voltage for a neighboring bitline such as plotted by curve 402 can be higher, the same (e.g., or approximately the same), or lower than the maximum precharge voltage plotted by curve 403.

Figure 5:
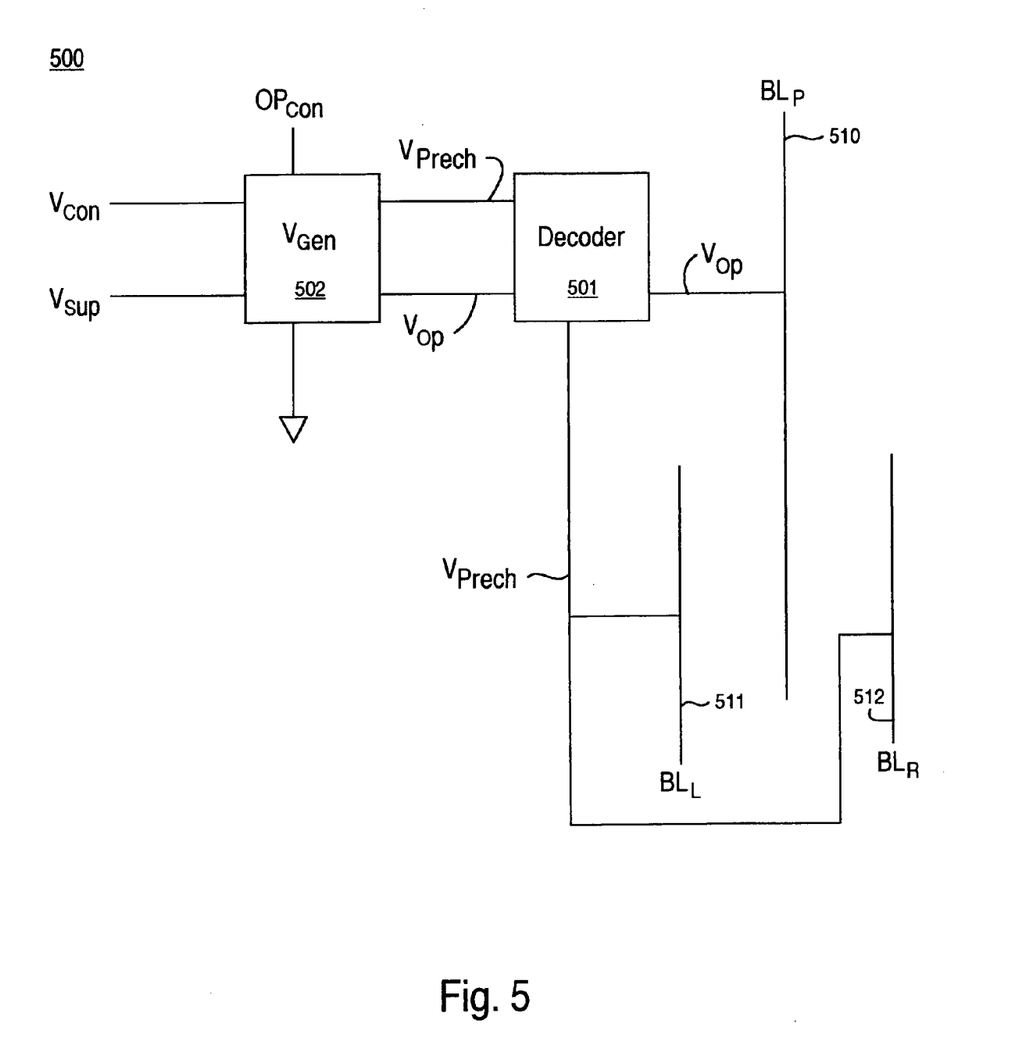
FIG. 5 depicts an exemplary circuit for applying an operating voltage to a bitline and pre-charging neighboring bitlines, according to an embodiment of the present invention.

FIG. 5 depicts an exemplary circuit 500 for applying an operating voltage to a bitline and pre-charging neighboring bitlines, according to an embodiment of the present invention. A voltage generator 502 accesses a supply voltage $V_{Sup}$ and generates operating (e.g., programming, read, etc.) voltages $V_{OP}$ and precharge voltage $V_{Prech}$.

Voltage generator 502 can generate $V_{OP}$ and $V_{Prech}$ according to various voltage ramp curves (e.g., voltage ramp curves 300, 400; FIG. 3, 5, respectively). Voltage generator 502 can access a voltage control signal $V_{Con}$ and a operations control signal 'OpCon'. A function of voltage generator 502 can be controlled by each of these signals.

For instance, a characteristic of the ramp curves and/or the voltages needed that correspond to a particular operation can be set for voltage generator 502 by the operations control signal. For another example, control over voltage generation by generator 502 can correspond to the voltage control signal, which can be sensitive to voltage sensed on the various bitlines.

Voltage generator 502 is coupled to a decoder 501. Decoder 501 addresses a bitline 510, connected to the drain of a memory cell to be operated, such that the operating voltage $V_{OP}$ is applied thereto. Further, decoder 501 addresses neighboring bitlines 511 and 512, which are proximate (e.g., adjacent) to bitline 510, such that the precharge voltage $V_{Prech}$ is applied to those neighboring bitlines.

Figure 6:
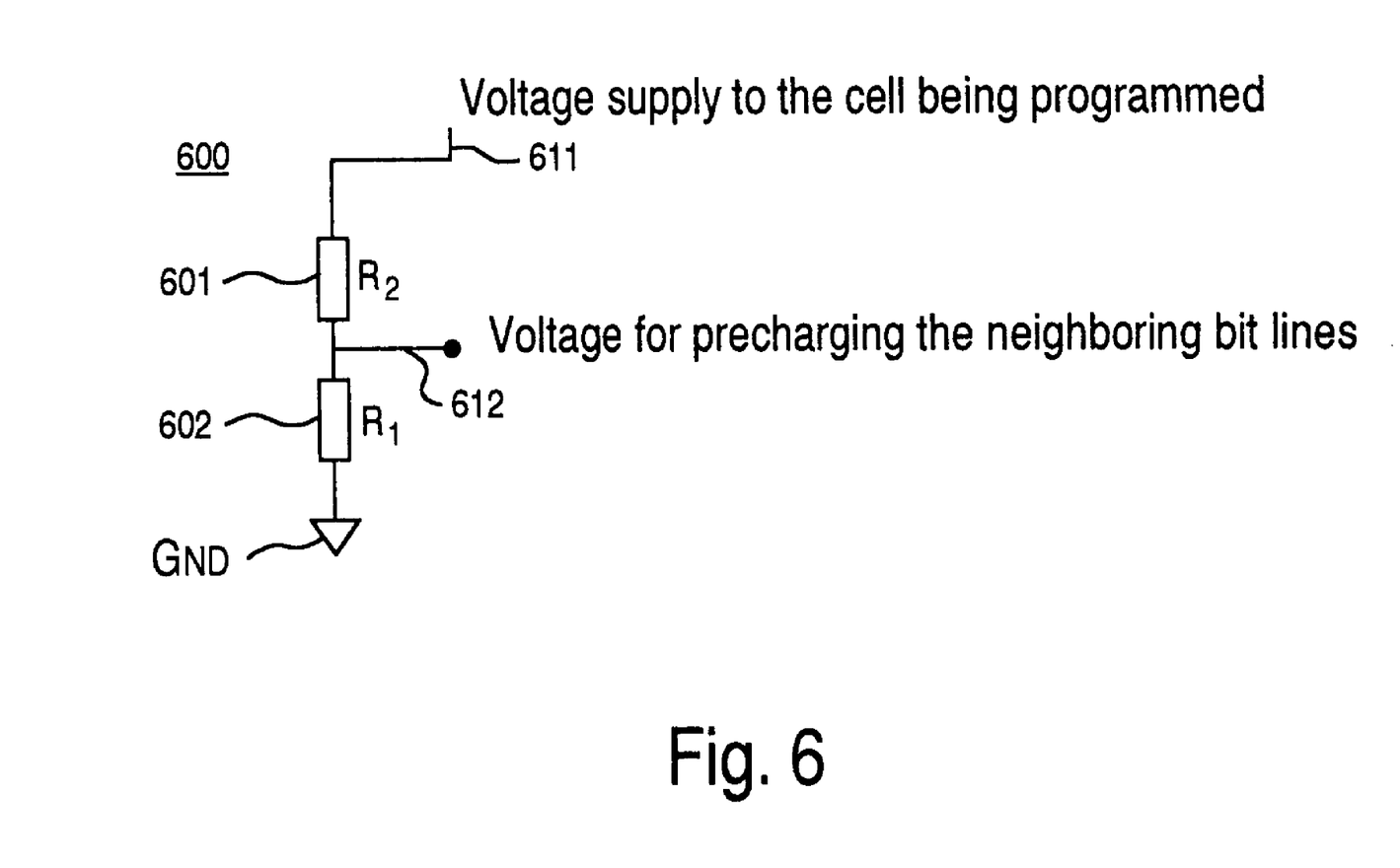
FIG. 6 depicts an exemplary circuit for generating an operating voltage and pre-charging neighboring bitlines, according to an embodiment of the present invention.

FIG. 6 depicts an exemplary circuit 600 for generating an operating voltage and pre-charging neighboring bitlines, according to an embodiment of the present invention. Circuit 600, which can be part of a voltage generator, comprises a network of resistor 601, in series with resistor 602. An operating (e.g., program, read, etc.) voltage supply 611 accessed by resistor 601 is dropped across that resistor to generate a precharge voltage, with respect to ground Gnd across resistor 602.

Figure 7:
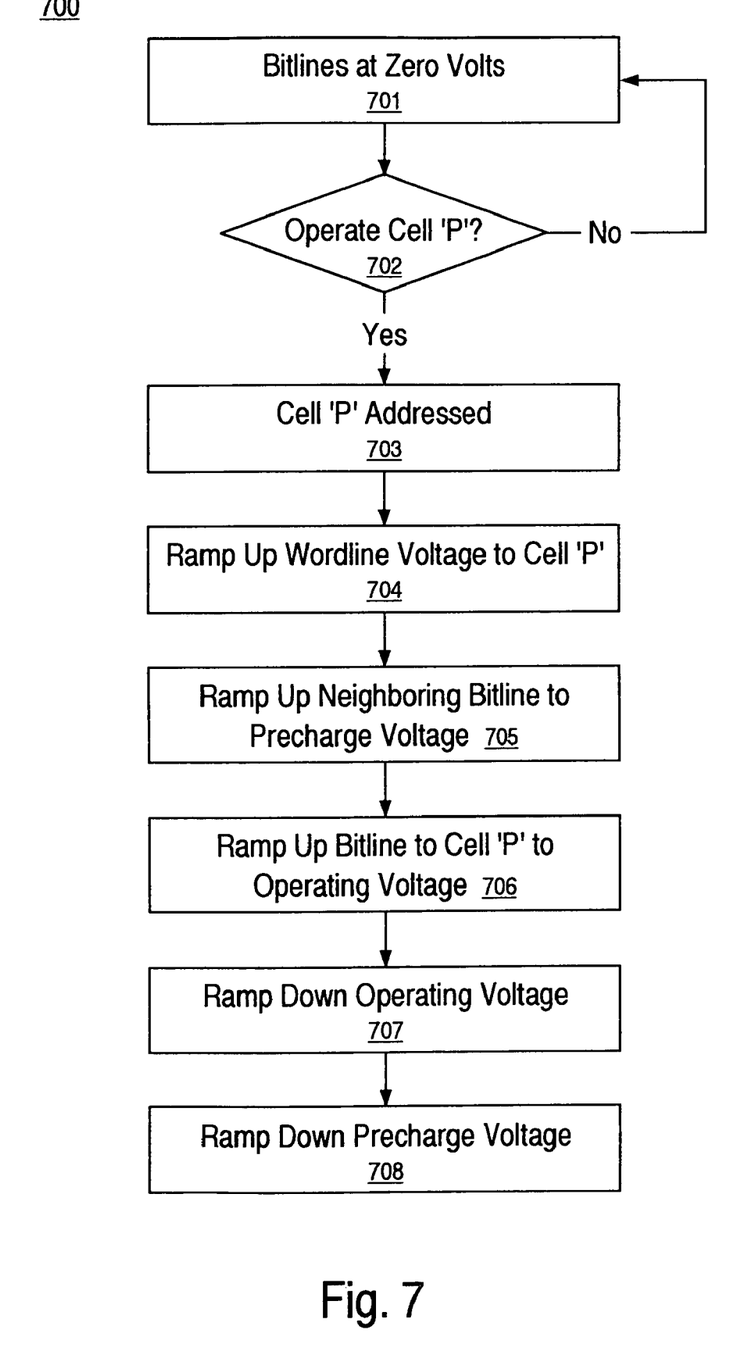
FIG. 7 is a flowchart of an exemplary process for operating a flash memory cell and pre-charging neighboring bitlines, according to an embodiment of the present invention.

FIG. 7 is a flowchart of an exemplary process 700 for operating a flash memory cell and pre-charging neighboring bitlines, according to an embodiment of the present invention. Process 700 begins with step 701, wherein the voltage on a bitline (BLP) connected to the drain of a cell P to be operated (e.g., programmed, read, etc.), as well as the voltages on bitlines neighboring (e.g., adjacent to) BLP are all at a non-operating voltage state (e.g., zero Volts).

In step 702, it is determined whether cell P is to be operated. If not, step 701 is repeated. Where it is determined that cell P is to be operated, in step 703, cell P is addressed (e.g., locating its associated wordline and bitline). In step 704, the wordline voltage is ramped up to the effective wordline voltage for operating cell P.

In step 705, the neighboring bitlines are ramped up to a precharging voltage. In step 706, BLP is ramped up to effective bitline operating voltage. In one embodiment, step 705 is performed prior to step 706. In another embodiment, steps 705 and 706 are performed effectively simultaneously. Further, the ramp up rates of the operating voltage and the precharge voltage can be the same or different. For instance, the operating voltage can ramp up at a higher rate than the precharge voltage.

Upon programming cell P, in step 707, the operating voltage is ramped down. In step 708, the precharge voltage is ramped down. In one embodiment, step 707 is performed prior to step 708. In another embodiment, steps 707 and 708 are performed effectively simultaneously. Further, the ramp up rates of the operating voltage and the precharge voltage can be the same or different. For instance, the operating voltage can ramp down at a higher rate than the precharge voltage. Process 700 can be complete upon the bitline voltages for BLP and the neighboring bitlines reaching a non-operating voltage state (e.g., zero Volts).

Figure 8:
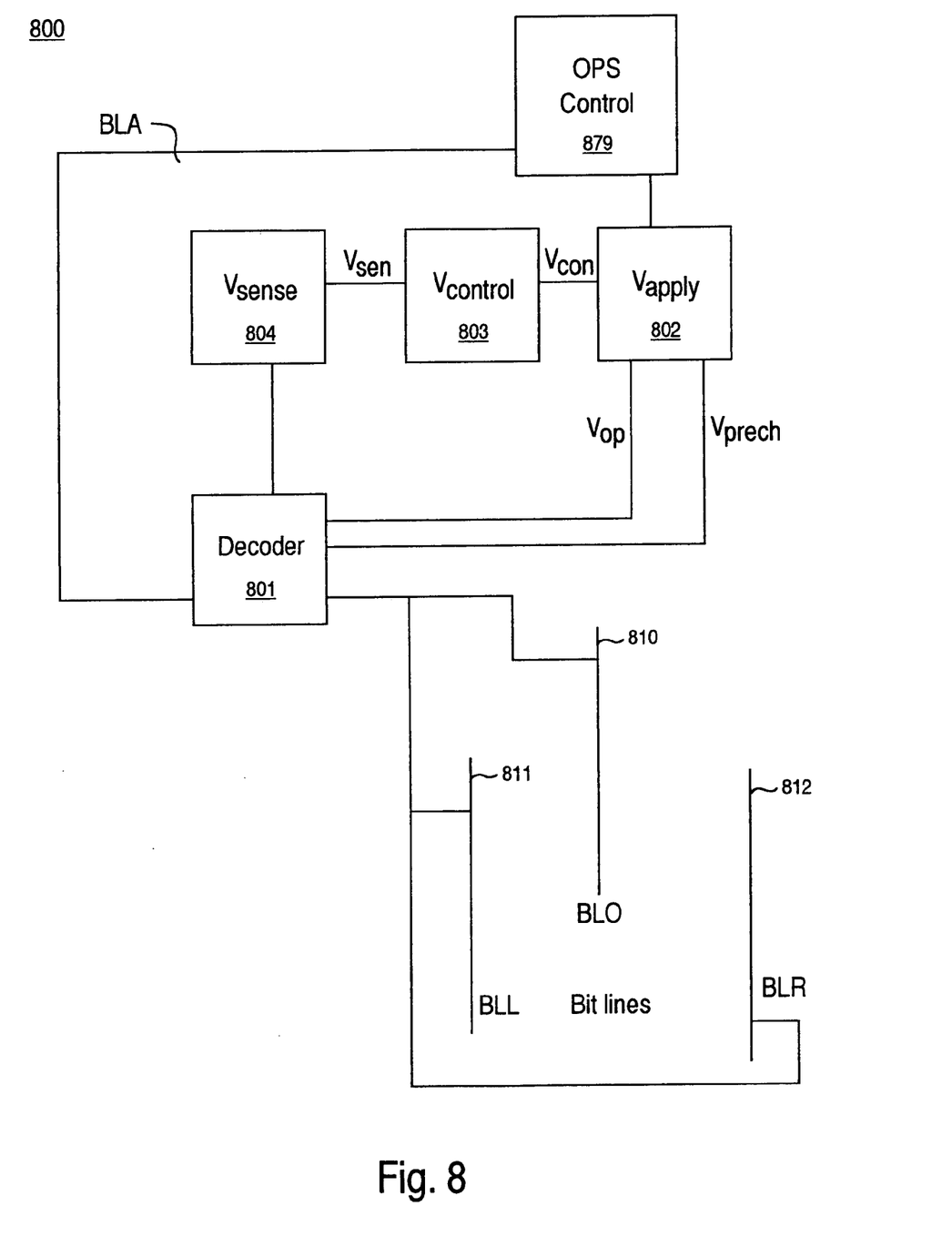
FIG. 8 depicts an exemplary system for performing memory related operations, according to an embodiment of the present invention.

FIG. 8 depicts an exemplary system for performing memory related operations, according to an embodiment of the present invention. A decoder 801 addresses an operating bitline 810 and neighboring bitlines 811 and 812, which can be adjacent thereto. A voltage sensing circuit 804 senses voltage on the bitlines addressed and generates a corresponding voltage sensing signal $V_{Sen}$, which is accessed by a voltage control circuit 803.

In response to the voltage sensing signal, voltage control circuit 803 develops a corresponding voltage control signal $V_{con}$, which is accessed by a voltage application circuit 802. In response to the voltage control signal, upon the command of an operations controller 899, voltage application circuit 802 generates an operating voltage and a precharge voltage. Decoder 801 allows the operating voltage to be applied to the operating bitline 810 addressed. Further, decoder 801 allows the precharge voltage to be applied to neighboring bitlines 811 and 812.

In one embodiment, operations controller 899 regulates a function of voltage application circuit 802. A characteristic of the ramp curves and/or the voltages needed that correspond to a particular operation, such as program, read, etc., can be set for voltage generator 502 by operations controller 899. Operations controller 899 provides, in one embodiment, a bitline selection for addressing signal BLA to decoder 801.

In summary, embodiments of the present invention pre-charge neighboring bitlines of memory cells not being operated to a voltage less than the operating voltage applied to a cell being operated. In one embodiment, the neighboring bitlines are pre-charged before the operating voltage is applied to the bitline of the cell being operated. In one embodiment, the neighboring bitlines are pre-charged at the time the operating voltage is applied to the bitline of the cell being operated.

An embodiment of the present invention, a method, system, and circuit for performing a memory related operation, is thus described. While the present invention has been described with reference to particular embodiments, the present invention should not be construed as limited by such embodiments, but rather construed according to the following claims and their equivalents.

What is claimed is:

1. A method for performing an operation relating to a memory, comprising:
    applying an operating voltage to a first bitline of said memory; and
    precharging a second bitline of said memory, wherein said second bitline is proximate to said first bitline and said precharging comprises applying a precharge voltage to said second bitline wherein said precharge voltage has a magnitude less than said operating voltage, wherein said operating voltage and said precharge voltage ramp up.

2. The method as recited in claim 1 wherein said operation comprises programming.

3. The method as recited in claim 1 wherein said operation comprises reading.

4. The method as recited in claim 1 wherein said memory comprises a flash memory.

5. The method as recited in claim 1 wherein said operating voltage and said precharge voltage ramp up at like rates.

6. The method as recited in claim 1 wherein said operating voltage and said precharge voltage ramp up at different rates.

7. The method as recited in claim 1 wherein said precharge voltage reaches its effective magnitude at effectively the same time as when said operating voltage reaches its effective value.

8. The method as recited in claim 1 wherein said second bitline is adjacent to said first bitline.

9. The method as recited in claim 8 further comprising precharging a third bitline of said memory, wherein said third bitline is proximate to said first bitline.

10. A circuit for performing an operation relating to a memory, comprising:
    a decoder for addressing a first bitline and a second bitline, wherein said second bitline is proximate to said first bitline; and
    a voltage generator coupled to said decoder for generating an operating voltage for a first bitline and a precharging voltage for said second bitline, wherein said precharge voltage has a magnitude less than said operating voltage and wherein said operating voltage and said precharge voltage ramp up at like rates.

11. A circuit for performing an operation relating to a memory, comprising:
    a decoder for addressing a first bitline and a second bitline, wherein said second bitline is proximate to said first bitline; and a voltage generator coupled to said decoder for generating an operating voltage for a first bitline and a precharging voltage for said second bitline, wherein said precharge voltage has a magnitude less than said operating voltage and wherein said operating voltage and said precharge voltage ramp up at different rates.

12. A circuit for performing an operation relating to a memory, comprising:
   a decoder for addressing a first bitline and a second bitline, wherein said second bitline is proximate to said first bitline; and
   a voltage generator coupled to said decoder for generating an operating voltage for a first bitline and a precharging voltage for said second bitline, wherein said precharge voltage has a magnitude less than said operating voltage and said precharge voltage reaches its effective magnitude at approximately the same time as when said operating voltage reaches its effective value.

13. A system for performing an operation relating to a memory, comprising:
   a decoder for addressing a first bitline and a second bitline, wherein said second bitline is proximate to said first bitline;
   a first circuit coupled to said decoder and for sensing a voltage on said first and said second bitlines and developing a corresponding voltage sensing signal;
   a second circuit coupled to said first circuit and for, responsive to said voltage sensing signal, developing a voltage controlling signal;
   a third circuit coupled to said second circuit and to said decoder and for, responsive to said voltage control signal and an operations control, generating an operating voltage for a first bitline and a precharging voltage for said second bitline, wherein said precharge voltage has a magnitude less than said operating voltage and wherein said precharge voltage ramp up, and
   an operations controller coupled to said third circuit and to said decoder and for directing said addressing and generating said operations control.

14. The system as recited in claim 13 wherein said operations control comprises:
   selecting said operation;
   setting said operating voltage and said precharge voltage according to said selecting;
   setting a ramp up rate for said operating voltage and said precharge voltage; and
   said directing said addressing.

15. The circuit as recited in claim 14 wherein said operating voltage and said precharge voltage ramp up, selectively, at like rates and at different rates.

16. The method as recited in claim 14 wherein said precharge voltage reaches its effective magnitude at approximately the same time as when said operating voltage reaches its effective value.

* * * * *